United States Patent
White

(10) Patent No.: US 7,595,271 B2
(45) Date of Patent: Sep. 29, 2009

(54) POLYMER COATING FOR VAPOR DEPOSITION TOOL

(75) Inventor: Carl L. White, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 24 days.

(21) Appl. No.: 11/566,124

(22) Filed: Dec. 1, 2006

(65) Prior Publication Data
US 2007/0128877 A1  Jun. 7, 2007

Related U.S. Application Data

(60) Provisional application No. 60/741,243, filed on Dec. 1, 2005.

(51) Int. Cl.
*H01L 21/00* (2006.01)
*B05C 11/11* (2006.01)

(52) U.S. Cl. .................................. 438/800; 118/504

(58) Field of Classification Search ............... 118/56, 118/45, 504; 438/800
See application file for complete search history.

(56) References Cited

U.S. PATENT DOCUMENTS

| | | | |
|---|---|---|---|
| 5,712,702 A * | 1/1998 | McGahay et al. ........... 356/311 |
| 6,825,051 B2 | 11/2004 | AmRhein et al. |
| 6,955,720 B2 * | 10/2005 | Gurer et al. .................. 118/52 |
| 6,974,781 B2 | 12/2005 | Timmermans et al. |
| 7,118,779 B2 | 10/2006 | Verghese et al. |
| 7,176,140 B1 * | 2/2007 | Rivkin et al. ................ 438/706 |
| 2004/0216667 A1 * | 11/2004 | Mitsuhashi et al. ......... 118/715 |
| 2005/0194355 A1 * | 9/2005 | Lohokare et al. ............. 216/68 |
| 2005/0260354 A1 * | 11/2005 | Singh et al. .................. 427/523 |
| 2006/0127699 A1 * | 6/2006 | Moelle et al. ............... 428/698 |
| 2006/0156981 A1 | 7/2006 | Fondurulia et al. |
| 2006/0162861 A1 * | 7/2006 | O'Meara et al. ........ 156/345.24 |
| 2006/0257243 A1 * | 11/2006 | Moriya et al. ................. 415/90 |

FOREIGN PATENT DOCUMENTS

JP   8-189574   7/1996

* cited by examiner

*Primary Examiner*—W. David Coleman
(74) *Attorney, Agent, or Firm*—Knobbe, Martens, Olson & Bear, LLP

(57) ABSTRACT

Described herein is an apparatus useful for depositing a material on a substrate. At least one component of the apparatus comprises a protective coating, which facilitates the cleaning and/or removal of the deposited material from the component. Also described are methods for depositing a material on a substrate using the disclosed apparatus, for fabricating the apparatus, and for cleaning the apparatus.

19 Claims, 2 Drawing Sheets

POLYMER COATING FOR VAPOR DEPOSITION TOOL

CROSS-REFERENCE TO RELATED APPLICATION

This application claims the benefit of U.S. application No. 60/741,243 filed Dec. 1, 2005, the disclosure of which is incorporated by reference.

BACKGROUND

1. Field of the Invention

This disclosure is generally related to thin-film manufacturing, and more particularly, to apparatus and methods for depositing a material on a substrate.

2. Description of the Related Art

Surfaces of equipment used in the thin film manufacturing process, for example, those used in the manufacturing of integrated devices often become contaminated with the materials deposited in the manufacturing process. For example, in atomic layer deposition (ALD) processes, the process chamber and components in the process chamber may become coated with the deposited material, for example, hafnia and/or alumina. These deposited materials are often difficult to remove. Consequently, components in deposition apparatus are often fabricated from materials, for example, titanium, that are resistant to the cleaning conditions, for example, wet-chemical etching.

SUMMARY OF THE INVENTION

Described herein is an apparatus useful for depositing a material on a substrate. At least one component of the apparatus comprises a protective coating, which facilitates the cleaning and/or removal of the deposited material from the component. Also described are methods for depositing a material on a substrate using the disclosed apparatus, for fabricating the apparatus, and for cleaning the apparatus.

Accordingly, some embodiments described herein provide a deposition apparatus comprising at least a portion that is susceptible to undesired deposition; and a protective coating is disposed on the at least a portion that is susceptible to undesired deposition. In some embodiments, the protective coating comprises a polymer, for example, polybenzimidazole.

Also provided is a method for depositing a material on a substrate comprising: depositing a material on a substrate in a deposition apparatus comprising at least a portion of the apparatus that is susceptible to undesired deposition, wherein a protective coating is disposed on the at least a portion of the apparatus that is susceptible to undesired deposition; optionally repeating the deposition step on a predetermined number of substrates; and removing the undesired deposition from the apparatus. In some embodiments, the undesired deposition is removed by etching and the protective coating resists the etching conditions, thereby protecting the portion of the apparatus that is susceptible to undesired deposition from the etching conditions. In other embodiments, the undesired deposition is removed by selectively removing the protective coating, for example, by etching the protective coating itself, thereby undercutting the undesired deposition.

Other embodiments provide a method for manufacturing a deposition apparatus comprising applying a protective coating at least a portion of the deposition apparatus that is susceptible to undesired deposition.

Also provided is a method for cleaning undesired deposition from a deposition apparatus, the method comprising: forming a protective coating on at least a portion of the deposition apparatus that is susceptible to undesired deposition; and removing the undesired deposition from the deposition apparatus.

Other embodiments provide an apparatus for thin film deposition comprising: a reaction chamber; a substrate support disposed in the reaction chamber; at least one inlet for reactant gas; and a protective coating comprising a polymer, wherein the protective coating is formed on at least a portion of a surface of the reaction chamber susceptible to build up of deposited material and susceptible to damage during cleaning.

In some embodiments, the reaction chamber is a single wafer reaction chamber. In some embodiments, the reaction chamber is at least one of a chemical vapor deposition reaction chamber and an atomic layer deposition reaction chamber. In some embodiments, the at least a portion of a surface of the reaction chamber comprises at least one of metal, titanium, titanium alloy, nickel, nickel alloys, stainless steel, aluminum, aluminum alloy, metal oxide, aluminum oxide, ceramic, carbon fiber, glass, polymer resins, and combinations and composites thereof. In some embodiments, the at least a portion of a surface of the reaction chamber comprises titanium.

In some embodiments, the polymer comprises polybenzimidazole (PBI). In some embodiments, a protective coating is formed on substantially all surfaces of the reaction chamber susceptible to build up of deposited material.

Other embodiments provide a method for processing a semiconductor substrate comprising: depositing a material on a semiconductor substrate in a reaction chamber, wherein at least some of the material is also deposited on a surface of the reaction chamber; and cleaning deposited material from the surface of the reaction chamber, wherein the surface of the reaction chamber comprises a protective coating comprising a polymer formed on the surface, and cleaning deposited material damages the surface of the reaction chamber in the absence of the protective coating. Some embodiments further comprise depositing the material on additional semiconductor substrates before cleaning the deposited material from the surface of the reaction chamber.

In some embodiments, at least a portion of the deposited material reaches a predetermined thickness before cleaning the deposited material from the surface of the reaction chamber. In some embodiments, depositing a material comprises depositing a material by at least one of chemical vapor deposition and atomic layer deposition. In some embodiments, depositing a material comprises depositing alumina by atomic layer deposition.

In some embodiments, the protective coating comprises polybenzimidazole (PBI).

In some embodiments, cleaning comprises at least one of removing deposited material from the protective coating and removing at least a portion of the protective coating. In some embodiments, cleaning comprises at least one of wet-chemical etching, dry etching, gas phase etching, plasma etching, ablation, bead blasting, and burn off. In some embodiments, cleaning consists essentially of chemical etching. In some embodiments, cleaning is performed ex situ.

Other embodiments provide a method for protecting a surface of a thin-film-deposition apparatus, the method comprising: applying a protective coating comprising a polymer to a surface of a thin-film-deposition apparatus, wherein the surface of the thin-film-deposition apparatus is susceptible to build up of deposited material in depositing a material on a substrate, and the protective coating protects the surface from damage during cleaning.

In some embodiments, applying a protective coating comprises at least one of dispersion coating, spray coating, thermal spray coating and plasma spray coating. In some embodiments, applying a protective coating comprises applying a plurality of layers. In some embodiments, applying a protective coating comprises applying polybenzimidazole (PBI). applying a protective coating is performed in refurbishing the thin-film-deposition apparatus.

DETAILED DESCRIPTION OF SOME PREFERRED EMBODIMENTS

Some embodiments described herein provide an apparatus useful for a thin film manufacturing process. A protective coating is provided on at least a portion of the apparatus, which permits the removal or cleaning of deposited material from the apparatus, for example, during cleaning and/or refurbishment. The use of a protective coating is illustrated herein in conjunction with an ALD reaction chamber; however, those skilled in the art will appreciate that the disclosed protective layer is also useful for other types of apparatus.

Figure 1:
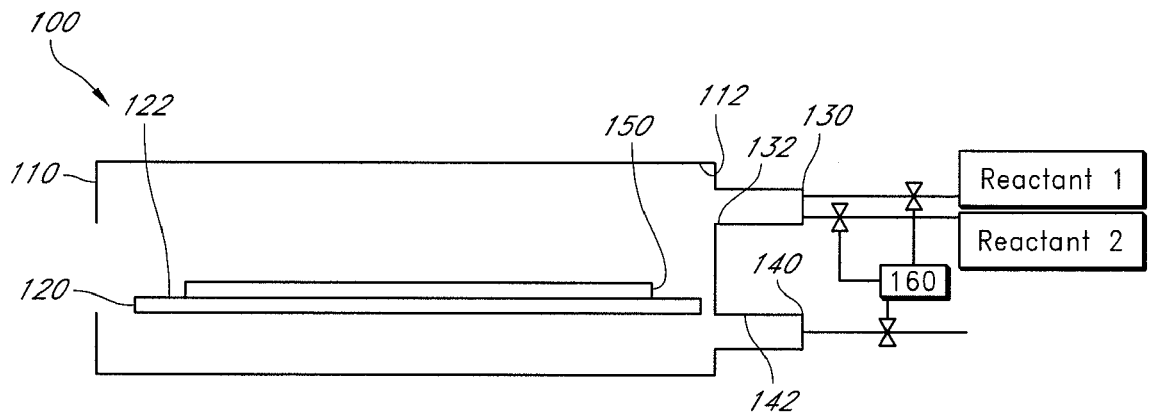
FIG. 1 schematically illustrates in cross section an embodiment of an apparatus with at least one component comprising a protective coating.

FIG. 1 illustrates in cross section an embodiment of a deposition apparatus 100 comprising a reaction chamber 110, a substrate support 120, a gas inlet 130, and a exhaust outlet 140. In the illustrated embodiment, the deposition apparatus 100 is an ALD processing chamber and is useful for depositing a material by ALD on a substrate 150 supported by the substrate support 120. Examples of materials deposited by ALD include zirconia, hafnia, and alumina. Those skilled in the art will understand that in other embodiments, the deposition apparatus 100 is another type of processing apparatus, for example, a chemical vapor deposition (CVD) processing chamber, which may comprise components other than those illustrated in FIG. 1, for example, lift pins, wafer chucks, showerheads, and the like. Advantageously, ALD is generally conducted at lower temperatures, preferably from about 200° C. to about 500° C., and more typically, from about 300° C. to about 400° C. The illustrated apparatus 100 includes a control unit 160 that automatically controls the introduction of reactants through the gas inlet 130, and the exhaust outlet 140. Not illustrated are other components known in the art, for example, devices for heating the substrate and/or the walls of the apparatus 100.

The reaction chamber 110 comprises an inner surface 112, at least a portion of which is susceptible to build up of an ALD-deposited material during the deposition of the material on the substrate 150. Similarly, the substrate support 120, gas inlet 130, and vacuum inlet 140 all comprise surfaces, 122, 132, and 142, respectively, susceptible to contamination by the ALD-deposited material. Those skilled in the art will understand that other embodiments of the deposition apparatus 100 comprise other surfaces that are susceptible to contamination by an ALD-deposited material. In general, all surfaces of the apparatus 100 exposed to all of the ALD reactants are susceptible to contamination.

In the illustrated embodiment, a protective coating is disposed on at least a portion of one of the deposition-susceptible surfaces of the reaction chamber 112, substrate support 122, gas inlet 132, and/or vacuum inlet 142. In some embodiments, the protective layer is disposed on substantially all of the surfaces of the deposition apparatus 100 that are accessible to both or all process gases. The protective coating facilitates the cleaning and/or removal of ALD-deposited material from the surfaces of the deposition apparatus 100, as discussed in greater detail below.

In some preferred embodiments, the ALD-deposited contaminant adheres well to the protective coating during the processing of substrates within the processing chamber, thereby reducing contamination in the chamber from deposited material flaking or falling off. In preferred embodiments, the protective coating resists damage or degradation under substrate-processing conditions, for example, chemical damage, thermal damage, photochemical damage, plasma damage, and combinations thereof. In some embodiments, the protective coating provides a desired surface texture, coefficient of friction, and/or temperature barrier.

The protective coating comprises one or more layers. In some preferred embodiments, the protective coating comprises a single layer. The layer or layers are applied by any method known in the art, for example, by dispersion coating, spray coating, thermal spray coating, and/or plasma spray coating.

In some embodiments, the protective coating resists chemical cleaning agents used to remove deposited material from components of the deposition apparatus 100, for example, during wet-chemical cleaning. Other methods for cleaning the deposited material include dry etching, gas phase etching, plasma etching, and combinations of liquid phase, gas phase, and/or plasma etching. In these embodiments, the protective coating acts as an etch stop. In these embodiments, the cleaning is in situ or ex situ.

Figure 3A:
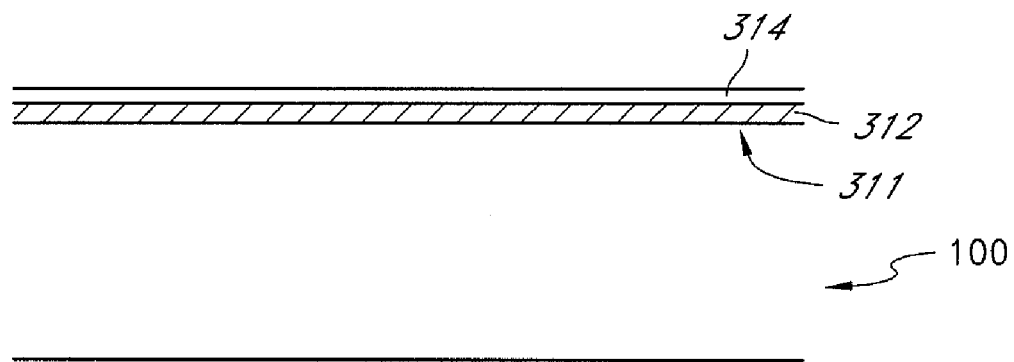
FIG. 3A schematically illustrates in cross section a portion of the apparatus of FIG. 1 with a removable protective coating on a surface of the apparatus.
Figure 3B:
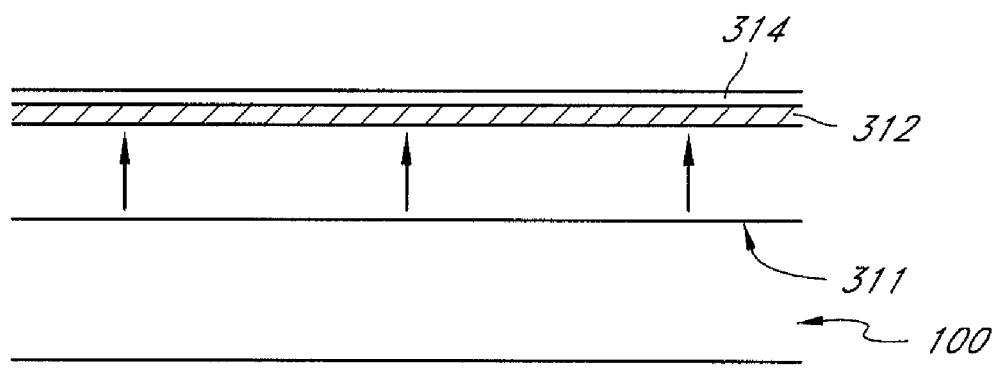
FIG. 3B schematically illustrates in cross section a method of lifting off the removable protective coating from the surface of the apparatus of FIG. 3A.

Referring to FIGS. 3A and 3B, in other embodiments, the protective coating 312 is itself removed from a surface 311 of the deposition apparatus 100, thereby also removing the deposited material 314, for example, when a component is refurbished. In these embodiments, the protective coating acts as a lift-off layer. Preferably, these embodiments are performed ex situ, which reduces the likelihood of contamination of other reactor components in the cleaning process, as well as permitting the use of cleaning conditions that may be unsuitable for other components in the reactor. In situ removal of the coating is also contemplated. In some embodiments, the protective coating is removed by burn-off. In some embodiments, the burn-off is plasma assisted, for example, using an oxidizing plasma, for example, generated from a gas comprising oxygen and/or ozone.

In some embodiments, the protective coating is entirely or partially removed chemically, for example, using suitable solvents, etchants, and the like. For example, in some embodiments, coatings comprising PBI are dissolved using a suitable solvent known in the art, for example, polar aprotic solvents including organic carboxamides, N-methyl-2-pyrrolidone (NMP), N,N-dimethylacetamide (DMAc), formamide, N-methylformamide (NMF), N,N-dimethylformamide (DMF), dimethylsulfoxide (DMSO), pyridine, combinations, and the like. Some embodiments further comprise stabilizers known in the art that reduces phase separation, for example, metal, lithium, zinc, and/or ammonium salts. Other suitable solvents include acids, for example, trifluoroacetic acid (TFA), phosphoric acid, polyphosphoric acid (PPA), sulfuric acid, combinations, and the like. In some embodiments, dissolving the protective coating is assisted, for example, by heating, physical processes (e.g., brushing, scrubbing, scraping, blasting, etc.), sonication, and the like. In some preferred embodiments, the protective coating is performed ex situ, particularly where the cleaning conditions increase the likelihood of contamination, for example, when using stabilizers.

In other embodiments, the protective coating serves both functions, that is, permitting cleaning of a component, in a step in which the protective layer is not removed but acts as an etch stop, then refurbishment by removing some or all of the protective coating. For example, in some embodiments, the protective coating comprises a layer that resists the cleaning conditions, and another layer that permits lift off. In other embodiments, a single layer acts as both an etch stop and a lift off layer. Those skilled in the art will understand that other arrangements are possible.

Some embodiments use physical and/or ablative process, for example, bead blasting, to either remove the deposited contaminant from the protective layer and/or to remove the protective layer itself. In some embodiments, each cleaning cycle removes one or more layers or portions of a thicker protective coating by an ablative process. Those skilled in the art will understand that combinations of physical and chemical process described above are also useful.

In some embodiments, after removal of some or all of the protective coating, a new protective coating is formed, as described above, for example, in refurbishment.

In some embodiments, one or more layers of the protective coating comprises a polymer, for example, polyetheretherketone (PEEK), polybenzimidazole (PBI), polyethyleneimine (PEI), polytetrafluoroethylene (PTFE), polyamideimide (PAI), polyethylene terephthalate (PET), polyoxymethylene (POM), polyamide (PA), polyalkenes, halogenated polyalkenes, and blends, mixtures, and copolymers thereof. In other embodiments, one or more layers of the protective coating comprise a polymer and other materials, for example, another polymer; a ceramic; a metal; or combinations, blends, copolymers, or mixtures thereof. In some embodiments, the protective coating does not comprise additives likely to generate contaminants, for example, stabilizers, phase separation stabilizers, plasticizers, and the like. For example, in the manufacture of integrated devices, because maintaining a clean environment in the reactor improves process reproducibility and yield, some preferred embodiments of the protective coating comprise substantially no additives.

In some preferred embodiments, one or more layers of the protective coating comprises polybenzimidazole (PBI), for example, Celazole® (Ticona/Celanese). Embodiments of polybenzimidazole exhibit combinations of one or more of the following properties: high strength, high compressive strength, high tensile strength at elevated temperatures (e.g., about 100° C.), non-melting, high glass transition temperature ($T_g \approx 427°$ C.), high heat deflection temperature (about 435° C.), very low coefficient of thermal expansion, good chemical resistance, good plasma resistance, thermal insulator, electrical insulator, high heat resistance, abrasion resistance, low outgassing, high purity, and/or low creep/good dimensional stability. Accordingly, embodiments of PBI are resistant to the conditions encountered in certain thin-film deposition processes for example, in low temperature ALD processes and other process conducted at temperatures below $T_g$. In some embodiments, one or more layers of the protective coating are substantially polybenzimidazole.

In some embodiments, the protective coating permits the underlying component to be manufactured from one or more alternative materials. For example, as discussed above, components of ALD deposition apparatus are often fabricated from titanium, at least in part because it resists the cleaning conditions for removing the ALD-deposited contaminants. In some embodiments comprising a protective coating, the underlying component comprises another material, for example, one or more of a metal (e.g. titanium, titanium alloy, nickel, nickel alloys, stainless steel, aluminum, aluminum alloy), metal oxide, aluminum oxide, ceramic, carbon fiber, glass, polymer resin, and combinations and composites thereof. In some preferred embodiments, the underlying component comprises titanium or titanium alloy. In some embodiments, components made of a material other than titanium has one or more advantages, for example, ease of manufacture, reduced cost, longer life, advantageous thermal properties, dimensional stability, and the like.

Figure 2:
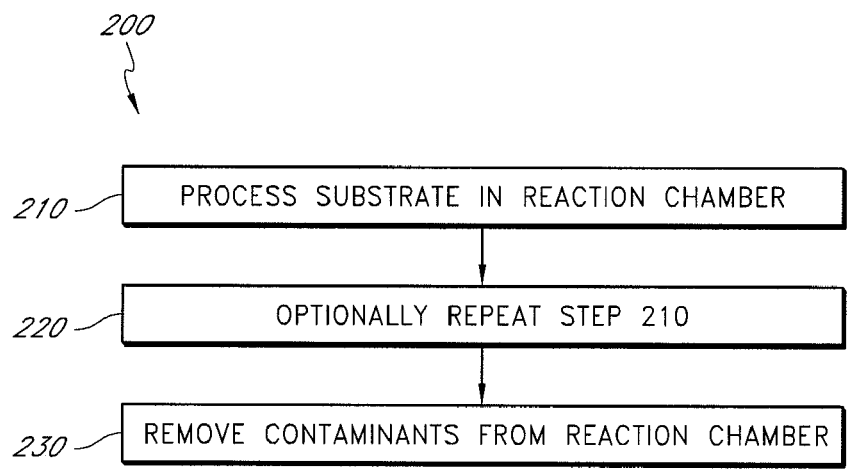
FIG. 2 is a flow chart illustrating a method for depositing a material on a substrate using the apparatus of FIG. 1.

FIG. 2 is a flow chart illustrating a method for processing a substrate 200 with reference to the deposition apparatus 100 illustrated in FIG. 1. In step 210, a substrate 150 is processed in the reaction chamber 110, for example, depositing a material on the substrate. In preferred embodiments, the processing is performed at a temperature below which the protective coating is damaged, for example, a decomposition temperature of one or more of the components of the protective coating, a glass transition temperature, a phase transition temperature, or the like. For example, as discussed above, $T_g$ for PBI is about 427° C. Accordingly, in some embodiments the processing is performed at less than about 427° C., less than about 400° C., less than about 300° C., or less than about 250° C. Suitable processes include deposition of $Al_2O_3$ by ALD, embodiments of which are performed at from about 130° C. to about 230° C. Other low-temperature ALD processes are also suitable, for example, depositing hafnia.

Suitable substrates are known in the art. In some embodiments, the substrate comprises a semiconductor, for example, silicon, germanium, gallium arsenide, III-V semiconductors, and the like. Preferably, the substrate is single crystal silicon. In other embodiments, the substrate comprises another material, for example, glass, quartz, silica, alumina, sapphire, ceramic, metal, alloys (e.g., AlTiC), and the like. Combinations are also useful, for example, silicon on sapphire substrates, silicon on insulator (SOI) substrates, and the like. Those skilled in the art will understand that such substrates are useful in the manufacture of integrated circuits or devices, heads for reading and/or writing magnetic media (e.g., disk drives, magnetic tapes, etc.) or in the manufacture of other types of devices, for example, microelectromechanical systems devices (MEMS), optoelectronic devices, and/or photonic devices.

In step 220, step 210 is optionally repeated a predetermined number of times. For example, in some embodiments, step 210 is repeated for at least about 1, for at least about 10, at least 100, or at least about 1000 substrates, for example, up to about 10,000, up to about 20,000, or up to about 100,000 substrates are processed between cleanings. In still other embodiments, the cleaning is performed after a predetermined thickness of a film of a contaminant is deposited on the deposition apparatus 100, preferably, from about 2 μm to about 200 μm, more preferably, from about 2 μm to about 40 μm. Those skilled in the art will understand that the interval between cleanings depends on factors known in the art, including the particular material deposited, the thickness of each deposition, the deposition conditions, the configuration of the deposition apparatus 100, and the like. In step 230, deposited material is cleaned from a protectively coated portion of the deposition apparatus 100. As discussed above, in some embodiments, the protective layer acts as an etch stop for a chemical cleaning process, while in other embodiments, it acts as a lift off layer, while in other embodiments, it performs both functions. For example, serving as an etch stop for a predetermined number of cleanings, then serving as a lift-off layer for refurbishment.

EXAMPLE

Titanium and aluminum coupons (5.08 cm (2")×5.08 cm×1.5 mm) were dispersion coated with polybenzimidazole (PBI Performance Products, Charlotte, N.C.) by AZ Electronic Materials (Tokyo, Japan). The coatings were from about 0.0015" (38.1 μm) to about 0.002" (50.8 μm) thick.

One coupon of each metal (aluminum and titanium) was heated in a vacuum oven to 200° C. for 1 hour, then allowed to cool to room temperature. No changes were observed in the appearances of the PBI coatings. The coatings did not detach from the metal substrates. The coupons also appeared unaffected and did not deform (bow or bend) from the thermal cycling.

The thermocycling of the same samples was repeated at 290° C., again, with no visible changes in the coupons or coatings. In each case, no separation of the PBI coating was observed.

The embodiments illustrated and described above are provided as examples of certain preferred embodiments. Various changes and modifications can be made to the embodiments presented herein by those skilled in the art without departure from the spirit and scope of this disclosure.

What is claimed is:

1. An apparatus for thin film deposition comprising:
a reaction chamber;
a substrate support disposed in the reaction chamber;
at least one inlet for reactant gas; and
a removable protective coating comprising a polymer, wherein the protective coating is formed on at least a portion of a surface of the reaction chamber susceptible to build up of deposited material and susceptible to damage during cleaning,
wherein the protective coating comprises at least one lift-off layer.

2. The apparatus of claim 1, wherein the reaction chamber is a single wafer reaction chamber.

3. The apparatus of claim 1, wherein the reaction chamber is at least one of a chemical vapor deposition reaction chamber and an atomic layer deposition reaction chamber.

4. The apparatus of claim 1, wherein the at least a portion of a surface of the reaction chamber comprises at least one of metal, titanium, titanium alloy, nickel, nickel alloys, stainless steel, aluminum, aluminum alloy, metal oxide, aluminum oxide, ceramic, carbon fiber, glass, polymer resins, and combinations and composites thereof.

5. The apparatus of claim 1, wherein a protective coating is formed on substantially all surfaces of the reaction chamber susceptible to build up of deposited material.

6. The apparatus of claim 1, wherein the polymer comprises polybenzimidazole (PBI).

7. The apparatus of claim 1, wherein the protective coating is an etch stop.

8. The apparatus of claim 4, wherein the at least a portion of a surface of the reaction chamber comprises titanium.

9. A method for processing a semiconductor substrate comprising:
depositing a material on a semiconductor substrate in a reaction chamber, wherein at least some of the material is also deposited on a surface of the reaction chamber; and
cleaning deposited material from the surface of the reaction chamber, wherein the surface of the reaction chamber comprises a removable protective coating comprising a polymer formed on the underlying reaction chamber surface,
wherein cleaning deposited material comprises lifting off the protective coating to remove the deposited material and at least a portion of the protective coating.

10. The method of claim 9, further comprising depositing the material on additional semiconductor substrates before cleaning the deposited material from the surface of the reaction chamber.

11. The method of claim 9, wherein depositing a material comprises depositing a material by at least one of chemical vapor deposition and atomic layer deposition.

12. The method of claim 9, wherein the protective coating comprises polybenzimidazole (PBI).

13. The method of claim 9, wherein cleaning comprises at least one of removing deposited material from the protective coating and removing at least a portion of the protective coating.

14. The method of claim 9, wherein the protective coating includes at least one lift-off layer, and cleaning deposited material comprises removing at least one of the lift-off layers with the deposited material.

15. The method of claim 10, wherein at least a portion of the deposited material reaches a predetermined thickness before cleaning the deposited material from the surface of the reaction chamber.

16. The method of claim 11, wherein depositing a material comprises depositing alumina by atomic layer deposition.

17. The method of claim 13, wherein cleaning comprises at least one of wet-chemical etching, dry etching, gas phase etching, plasma etching, ablation, bead blasting, and burn off.

18. The method of claim 13, wherein cleaning consists essentially of chemical etching.

19. The method of claim 13, wherein cleaning is performed ex situ.

* * * * *

UNITED STATES PATENT AND TRADEMARK OFFICE
CERTIFICATE OF CORRECTION

| | | |
|---|---|---|
| PATENT NO. | : 7,595,271 B2 | Page 1 of 1 |
| APPLICATION NO. | : 11/566124 | |
| DATED | : September 29, 2009 | |
| INVENTOR(S) | : Carl L. White | |

It is certified that error appears in the above-identified patent and that said Letters Patent is hereby corrected as shown below:

At column 2, line 60, delete "bum" and insert -- burn --, therefor.

At column 4, line 53, delete "bum-off." and insert -- burn-off. --, therefor.

At column 4, line 54, delete "bum-off." and insert -- burn-off. --, therefor.

Signed and Sealed this

Sixteenth Day of February, 2010

David J. Kappos
*Director of the United States Patent and Trademark Office*